United States Patent [19]

Donner et al.

[11] Patent Number: 5,611,696
[45] Date of Patent: Mar. 18, 1997

[54] HIGH DENSITY AND HIGH CURRENT CAPACITY PAD-TO-PAD CONNECTOR COMPRISING OF SPRING CONNECTOR ELEMENTS (SCE)

[75] Inventors: Edward O. Donner, Poughkeepsie, N.Y.; Michael L. Zumbrunnen, Rochester, Minn.

[73] Assignee: International Business Machines Corporation, Armonk, N.Y.

[21] Appl. No.: 355,564

[22] Filed: Dec. 14, 1994

[51] Int. Cl.⁶ ................................................. H01R 9/09
[52] U.S. Cl. ........................................ 439/66; 439/71
[58] Field of Search .............................. 439/66, 71, 67

[56] References Cited

U.S. PATENT DOCUMENTS

| | | | |
|---|---|---|---|
| 3,921,285 | 11/1975 | Krall | 29/626 |
| 4,764,848 | 8/1988 | Simpson | 361/408 |
| 5,061,192 | 10/1991 | Chapin et al. | 429/66 |
| 5,123,848 | 6/1992 | August et al. | 439/66 |
| 5,248,262 | 9/1993 | Busacco et al. | 439/66 |

Primary Examiner—Neil Abrams
Assistant Examiner—Eugene G. Byrd
Attorney, Agent, or Firm—Bernard M. Goldman

[57] ABSTRACT

A new approach to providing thousands of contacts between electronic packages and their next package level by use of small formed spring contact elements (SCE) retained within a interposer structure or soldered directly into a printed circuit board or onto the module is disclosed. Each contact element can be either a signal or power line and, for improved electrical performance, alternate both horizontally and vertically in an orthogonal grid such that no signalling is adjacent to another signal. The spring contact elements (SCE) have multiple cross-sectional shapes and are preformed for improved mechanical performance. A retainer contains the multiplicity of SCE while providing a air plenum for improved thermal performance.

20 Claims, 7 Drawing Sheets

HIGH DENSITY AND HIGH CURRENT CAPACITY PAD-TO-PAD CONNECTOR COMPRISING OF SPRING CONNECTOR ELEMENTS (SCE)

BACKGROUND OF THE INVENTION

This invention relates to a device for interconnecting two electronic components with large number of individual connections that can be easily disconnected and reconnected, can accommodate surface irregularities and thermal expansion/contraction between the components. A large number implies thousands.

As the circuit density increases on the chip, the number of input and output signals to these circuits also increases. These I/O's are compressed into a small area to accommodate the chip density and are used for the chip to communicate to other nearby chips or to other components in the system. The chips can be attached to a ceramic device as shown in U.S. Pat. No. 3,921,285, issued to Krall and assigned to the same assignee as this invention. This patent shows a rigid ceramic chip carrier attached to silicon integrated chips. This ceramic carrier is usually attached to a printed circuit board which integrates a large number of these chips contained on ceramic chip carriers. On systems with multiple processors usually multiple ceramic carriers are used to allow for performance growth in the customers office by adding additional processors. High reliability is a key and essential criteria for a separable and reconnectable connector for these ceramic chip carriers and as a result must be tolerant of dust and mini fibers.

Also when connecting two surfaces, such as the ceramic material and the glass-epoxy printed circuit board, a significant amount of compliance is required for the glass-epoxy board and must be accommodated by the connector. This is due to the flatness and irregularities inherent in the surfaces of the board and electronic module. The planarity and rigidity of the ceramic is relatively good and as pressure is applied to the edge of the ceramic component to make connection for a plurality of connectors, the glass epoxy printed circuit board has a tendency to bow as the area array increases. This bowing must be accommodated by the connector. Very large ceramic modules may bow as well if pressures are applied to the perimeter only.

An article titled "High Density Pinless Module Array Connector" by R. Darrow et al, IBM Technical Disclosure Bulletin, Vol. 28, No. 3, page 1079, (August 1985) discloses a connector assembly with wires bent to form a C spring at one end with the other end inserted into the plated through hole of a printed circuit board and soldered. The C spring rests on a plastic housing that supports the force applied by the ceramic module. The density of this connector array is limited by the density of the plated through holes in the printed circuit board and the plastic housing to support the force applied to the C spring by the ceramic module. Density will also be impacted by the C spring shape infringing with the adjacent C spring.

U.S. Pat. No. 4,764,848 issued to Simpson discloses a connector of bent wires which are soldered to both the ceramic chip carrier and the printed circuit board. Each wire has a root at one end and a tip at the other end. The root of each bent wire is attached to the integrated circuit package to form a fixed electrical and mechanical connection. The tip of the bent wire is soldered to a pad on the surface of the printed circuit board. This arrangement provides for strain relief of the connection and mechanically fixes the ceramic device to the board. This disclosure does not provide for an easily removable connector, especially in the customers office.

U.S. Pat. No. 5,248,262 issued to Busacco, et al and U.S. Pat. No. 5,061,192 issued to Chapin, et al discloses a connector assembly with small flat beams attached to a flexible film and contained inside a housing. The small flat beams are copper etched on a polyamide strip, are placed in and extend through the housing, and make contact with pads on circuit members on opposite sides of the connector assembly. This strip of connecting elements is made from several layers of etched or bonded material including a conducting element that contacts the pads, a polyamide backing material, a copper ground plane material and, in the case of U.S. Pat. No. 5,248,262, a stainless steel spring material bonded to but electrically isolated from the copper ground plane. A plurality of the connector elements are contained, and spaced evenly, on the polyamide strip along with the stainless steel spring. The housing contains long slots for the strips to protrude through the surface to make contact with pads on circuit members. The polyamide film retains the contact elements in a single strip and multiple strips make up a connector assembly. Within a single strip, compliance is limited from contact to contact because of the rigidity of the film in that direction. Each contact element has its reacting stresses and strains within its joints set by the amount of its compression and the amount of compression of its adjacent neighbors. As a result, some of the stresses and strains are parallel with the strip and cause shearing to the assembly. To limit the adverse affect of the shearing forces, two precautions must be taken. One is to limit the surface flatness irregularity of the printed circuit board to be within the design limits of the connector assembly. Second, each contact within a strip should be compressed simultaneously, i.e., upon assembly, guides should be used to uniformly force the electronic module upon the array with minimum degree of tilt.

Inherent with the design of having multiple contacts contained within a single strip is that a constant spacing is present between adjacent strips. This limits the degree of optimization of the connector assembly to the application. The tolerances associated with fabricating a single connector strip and bonding to a spring strip may limit the overall length of the strip; and hence, the number of contacts of the connector assembly. The use of connector strips limits the ability to adjust at each contact point the forces applied to the electronic components. These forces caused by the springs will bow the mating surfaces, and depending on the application, may limit the number of contacts allowable. Thus, for high performance applications with high input and output requirements, it is desirable to customize the spring characteristics based on spacial position within the connector array so that module deflections are minimized and number of contacts are maximized.

It is believed that a separable connector that provides superior electrical characteristics, high reliability, low cost and simple to manufacture, the flexibility to personalize to each application and other advantageous key features below, as contained in this disclosure, advances the state or the art.

It would be highly desirable to have a simple, inexpensive, contact element made from a common source which is extremely reliable with no failures due to delimitations and failed bonds resulting from thermal cycling and aging.

It would also be desirable to have a device to retain these contact elements such that air spacing is provided to adjacent elements for performance and cooling.

It is highly desirable this retainer provide precision alignment via holes and the material can be adjusted for thermal expansion, also with this arrangement each element can individually react to the contact surface.

Also it would be advantageous to personalize the characteristics of each individual contact element and its spacial relationship to the neighboring contact element.

It is also highly desirable that the retainer and contact element assembly accommodate the thermal mismatches between the mating components.

Also it would be essential that the following criteria be met in the disclosure to enhance its flexibility of application:

To improve the packaging density, both sides of the printed circuit board should be utilized which reduces the average wire length and improves the performance of the system.

To provide the maximum density of connections, an area array of these contacts is necessary. Any other configuration would not provide sufficient connections in a given area.

The connector assembly must also exhibit the characteristic of low electrical noise since the application will connect very high speed integrated circuits.

The connector assembly must support large amounts of current in this small area. This leads to a requirement for cooling the connector as power demands are significant.

SUMMARY OF THE INVENTION

The objects of this invention are to improve the interconnectivity performance, density, current carrying capacity and cost of joining in a separable manner an electronic module to a printed circuit board.

The above objects are realized by utilizing a plurality of SCE as the electrical interconnect. The SCE are shaped to provide optimized mechanical forces to assure electrical contact across the electronic module. An automated fabrication process as shown in application Ser. No. 08/356,025, filed on the same day as the present application, entitled "Apparatus and Process for Manufacture of Spring Contact Elements And Assembly Thereof" and assigned to the same assignee as this application, can be implemented to stamp the appropriate shape of the SCE. Inherent with the invention are overlapping connector wire segments which, due to the included angle, improve the shielding of the SCE segments. In a preferred embodiment, the SCEs are not connected to the module or the printed circuit board but are housed in a retainer. In this case, the invention is a separate assembly or field replaceable unit (FRU).

The present invention can be embodied with attachment to the module or can be attached to the printed circuit board or the ceramic components containing the chips.

BRIEF DESCRIPTION OF THE DRAWINGS

FIG. 2 contains three view of the SCE.

DESCRIPTION OF THE PREFERRED EMBODIMENTS

The present invention relates to an enhanced electronic connector having improved density, current carrying capacity, lower cost, and improved heat dissipation. The improved connections, according to a preferred embodiment, comprises a plurality of short SCEs closely spaced together. The elements are optimally shaped to provide maintain a large cross-sectional area for reduced electrical resistance while minimizing the mating forces needed to achieve electrical contact between the electronic module and the printed circuit board. The shape of the elements may vary with its location in the connector array.

Figure 1A:
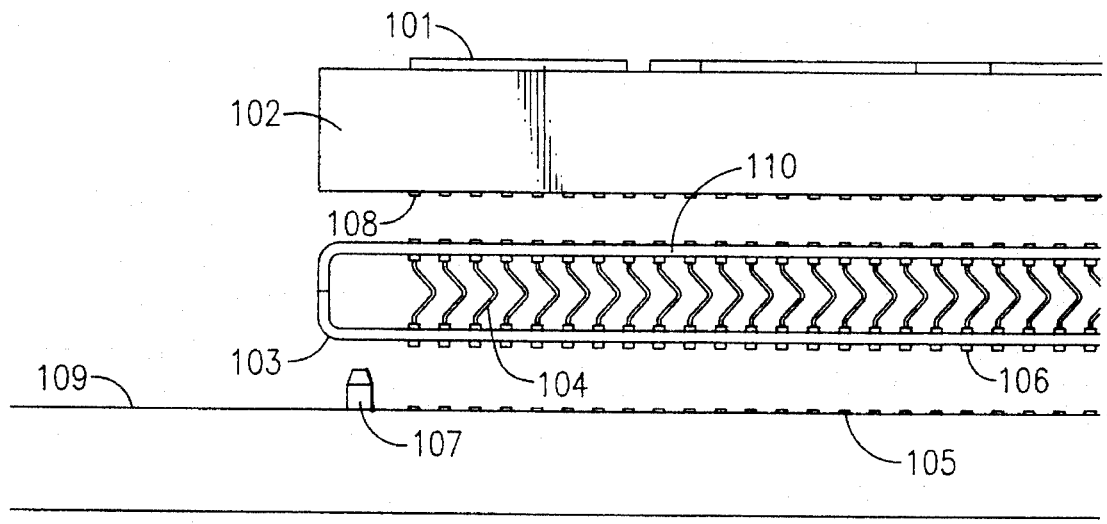
FIG. 1A shows an overview of a cross-section of the completed assembly of this invention in its preferred embodiment.
Figure 1B:
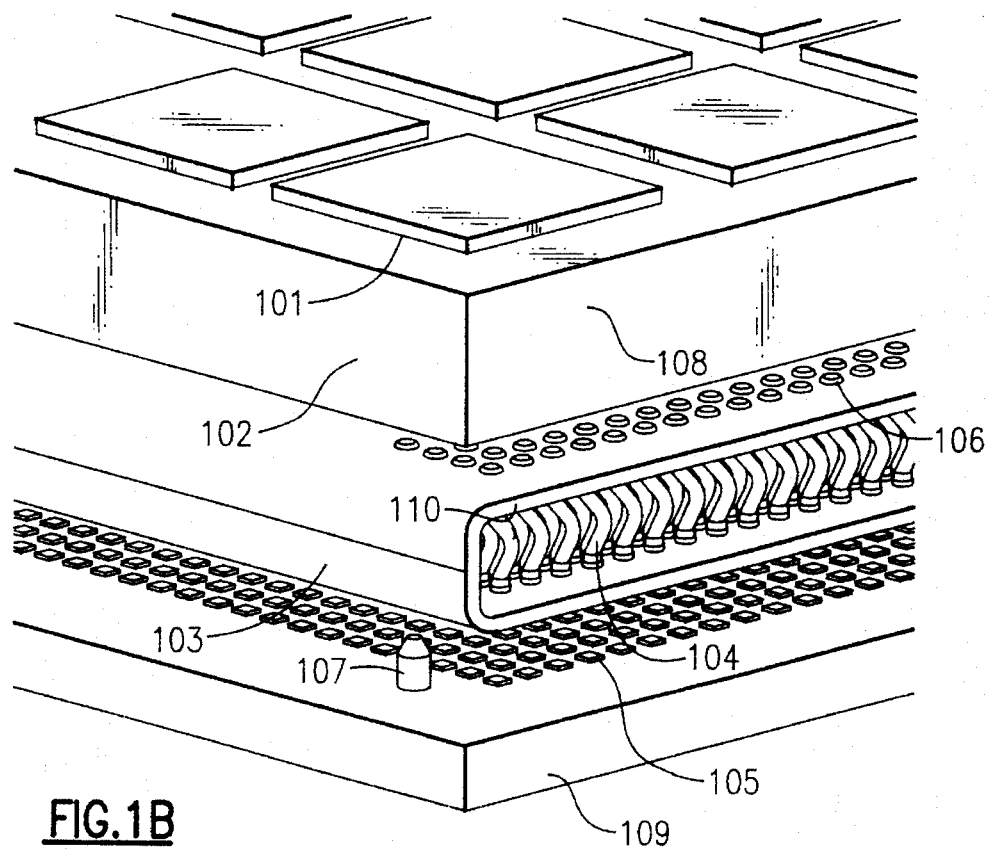
FIG. 1B shows an isometric view of the same completed assembly shown in FIG. 1A.

FIG. 1A is a side cutaway of a high performance multi-chip module with an improved electronic connector according to the first embodiment of the present invention. FIG. 1B represents an isometric expanded view of the same assembly shown in FIG. 1A. As is conventional, the module of FIG. 1A and 1B includes an array of integrated circuit chips 101 mounted to a substrate 102. For this invention, the substrate 102 includes pads 108 which are used to establish electrical connections to the pads 105 on the motherboard 109 via the SCEs 104 and are located relative to the pads 105 and 108 by guide pins 107.

The SCEs 104 are retained by a upper housing 110 and lower housing 103 and their tips 106 extend slightly outside the upper and lower housings. In the assembled position, the SCEs accommodate the application x-y-z tolerances and thermal expansion mismatches and the SCEs are not necessarily identical to one another.

In these figures, only a portion of the SCE array is visible, and one can imagine the array extending to many rows and columns as required by the application. In general, the connector can house N rows×M columns of SCEs with N and M not necessarily equal. To achieve the high density objective of this invention, it is desirable to space each SCE as close as possible to one another. The degree to which the space between the spring contact elements can be reduced is dependent on the ability to manufacture the connector as well as the ability of the motherboard to support the sheer number of interconnections in a small area. A typical centerline spacing satisfying these constraints is 1 to 1.5 mm.

Figure 2A:
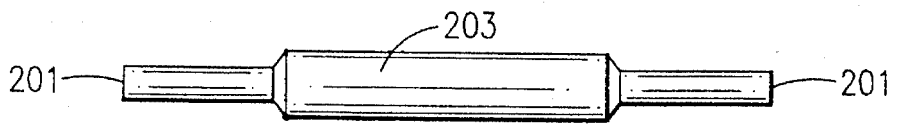
FIG. 2A is a top view.
Figure 2B:
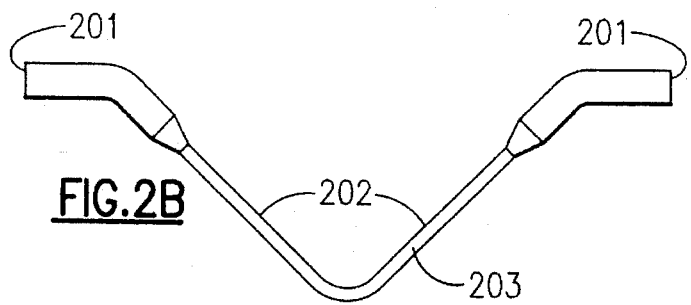
FIG. 2B is a side view and FIG. 2C is an end view.
Figure 2C:
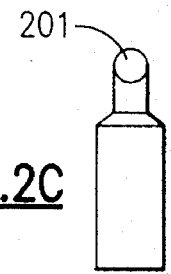

A close-up of top, front, and side views of a single SCE are shown in FIGS. 2A, 2B, and 2C, respectively. The SCE was manufactured from a round cross-sectional wire and formed into the shape shown. For illustrative purposes, beryllium copper C17200 half hardened, can be the bulk beam material. This material is readily available in wire form, widely used as a spring material, has very good workability and soldering properties, and has reasonable electrical conductivity (22% pure copper). Any other material having these attributes is suitable for this invention. The bulk material is prehardened by heat treating in an oxygen-free atmosphere and then electroplated with nickel and palladium for resistance to corrosion. An automated fabrication process consisting of dicing, stamping, and forming the wire into individual SCE can be employed for mass production. Alternatively (and for prototype hardware), the above process steps can be done manually. The SCE ends 201 are gold electroplated for low joint contact resistance. The forming tool flattened the round cross-section into a rectangular cross-section 203 at only a prescribed portion centered about the wire tips. In addition, the SCE was bent to form an included angle 202 and, once completed, the two SCE tips 201 were aligned co-axially. This invention allows for optimization of the SCE to the electronic module application by adjusting the wire material, the included angle 202, and the degree of cross-sectional shaping 203. An improved electronic connector shown in FIGS. 1A and 1B could be comprised of one or multiple part number SCEs for localized force/contact optimization.

Figure 3C:
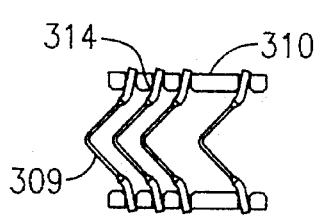
FIG. 3C is an exploded view of the cross-section shown in FIG. 3A with the SCE compressed.
Figure 3B:
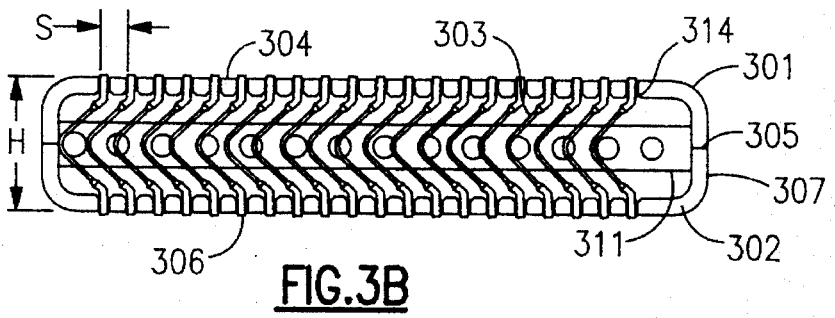
FIG. 3B is a top view of the connector assembly.
Figure 3A:
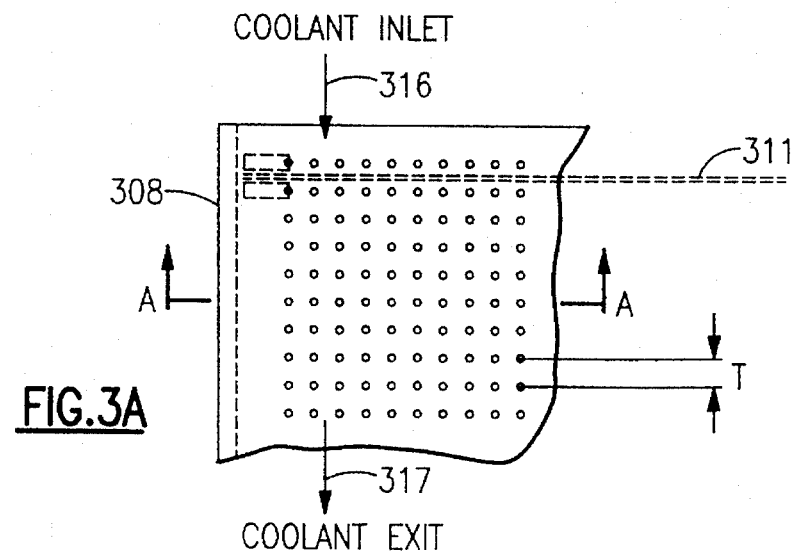
FIG. 3A is a cross-sectional view of the preferred embodiment in which the connector assembly is not attached to either the ceramic component or the printed circuit board.

FIG. 3B illustrates the preferred embodiment cross-section with SCE 303 being held in place with retainer halves 301 and 302. The mating surface between the two halves is indicated by 305. A perforated dielectric separator 311 is located between the rows of SCE 303 to keep them from shorting to each other. The retainer halves 301 and 302 are fabricated from a dielectrical material to provide electrical isolation between all SCE 303. If required, air can be forced through the retainer as shown in FIG. 3A. This allows for cooling in high current applications. The coolant 316, air for example, is pumped through the interior of the retainer halves and flows above, below, and through the perforated separators 311. The heated coolant exhausts at the other end of the retainer at 317. The side walls 307 and 308 attached the two retainer halves together and prohibit the coolant from escaping prematurely. The coolant entrance and exit sides of the retainer halves may have discrete mating locations for extra large connector applications. The grid distances between the SCE, S, may vary but is typically between 1 and 1.5 mm as previously stated. The outer edges of the retainer are indicated by 307 and 308. The tips of the SCE 304 protrude through the retainer and make contact with gold plated pads 105 on the surface of the attaching component as does the other end 306 to pad 108. As pressure is applied by these components from opposite sides, the SCEs 303 are compressed into the retainer halves 301 and 302. The holes 314 are countersunk on the inside of the retainer halves to keep the SCEs 303 from binding on the inside of the retainers. The overall height of the connector assembly, H, is typically between 4.5 and 7.5 mm. FIG. 3B shows the SCE 303 in the uncompressed position. FIG. 3C is an enlarged view of FIG. 3B showing the SCE in an exaggerated compressed position. Sufficient clearance is provided by the countersunk holes 314 as depicted. Not shown are the upper and lower electronic modules which applies the compressing force upon the SCEs 303. FIG. 3C also illustrates the embodiment in which the spacing 310 between SCEs 303 need not be uniform across the array. This is also true for the direction in to and out of the plane illustrated in the figure.

Figure 4:
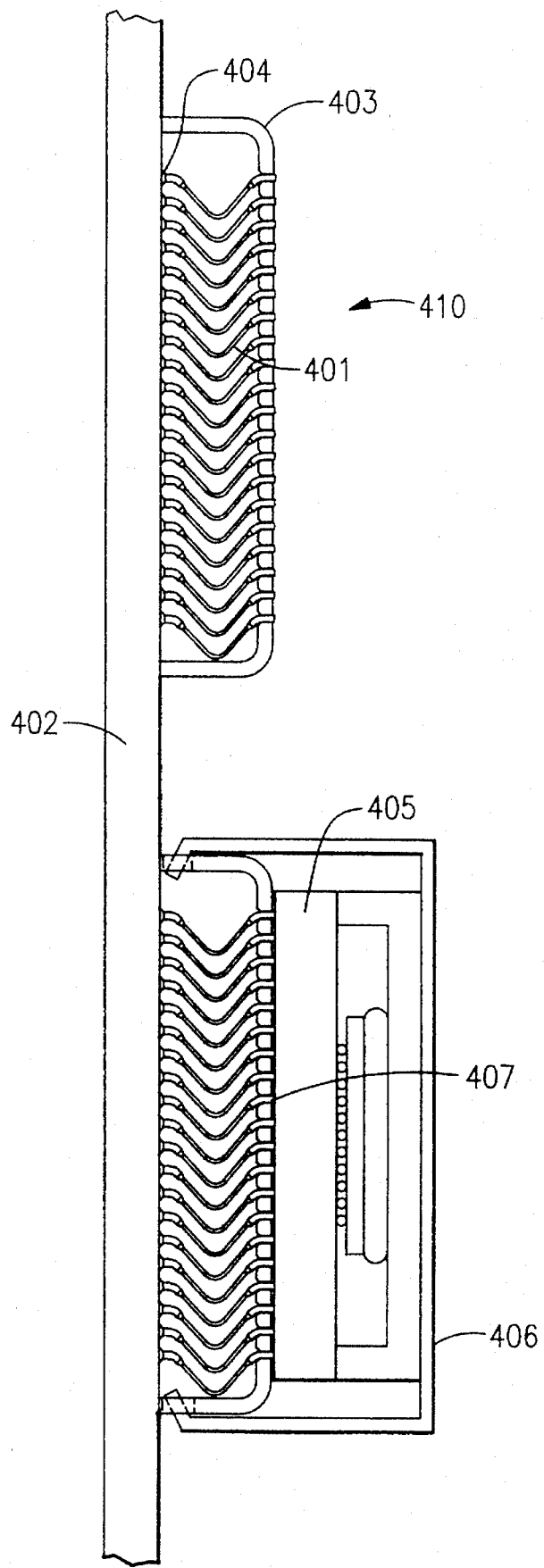
FIG. 4 is a cross-sectional view of the embodiment in which the improved connector is attached directly to the printed circuit board.

FIG. 4 illustrates an embodiment where the improved electronic module connector 410 is attached directly to the printed circuit board 402. For this embodiment, a single housing 403 is used to retain and protect the array of SCEs. Small x-y adjustments to the SCE array can be made during the installation of the retainer/plenum 403. The SCE tips are attached to the printed circuit board by a solder joint 404 and inspection of the joints can be performed by conventional inspection methods. The contact pads of the printed circuit board may be at finer spacings than the plated through holes provided that surface wiring is present to route the lines to vias for access to the internal wires. The high performance contact to the electronic module 405 occurs as the module is compressed against and held in place with a spring retention clip 406. As previously noted, the ends of the SCE 401 are compressed against the gold pads 407 on the surface of the module. In this embodiment the connector assembly 410 becomes part of the printed circuit board 402 field replacement unit (FRU).

Figure 5:
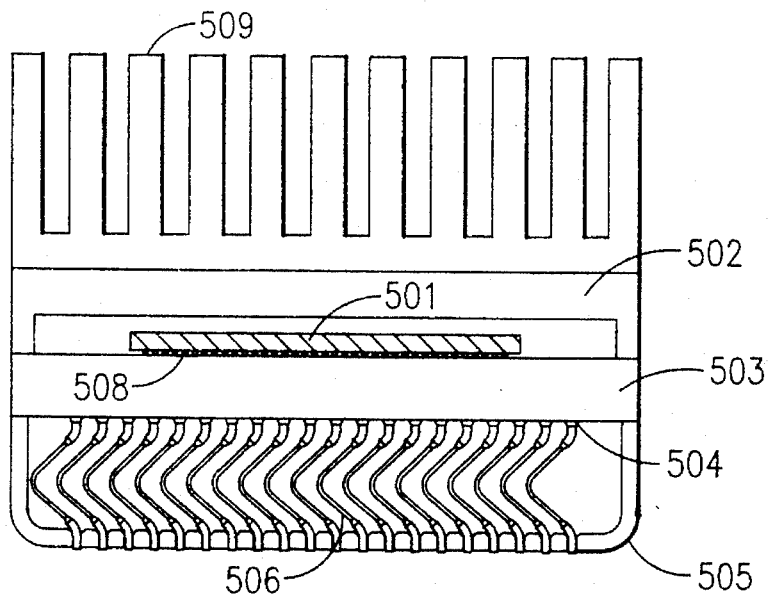
FIG. 5 illustrates the improved electronic connector embodiment in which it is attached to the bottom surface of a single chip or multi-chip module.

Another embodiment has the connector assembly attached directly to the electronic component. FIG. 5 shows a integrated chip 501 attached to the opposite side of the base of the component 503 from the connector with a very dense array of solder balls 508. The chip is encapsulated with a cooling frame 502, and for high powered applications, a heat sink 509 is attached. In this embodiment the air flow used to cool the highly integrated chip can also cool the SCE 506 is required. For input, output and power connections to the module, spring contact elements 506 are attached (soldered or any other suitable method) to the component 503 at 504 and become part of the FRU. The SCEs 506 protrude beyond the retainer 505 and make contact to pads on the printed circuit board. The retainer 505 is aligned to the electronic component 503 and held in place with an adhesive or some other mechanical method. This embodiment permits the SCE 506 to be on a smaller FRU and one that is easily replaceable.

Figure 6:
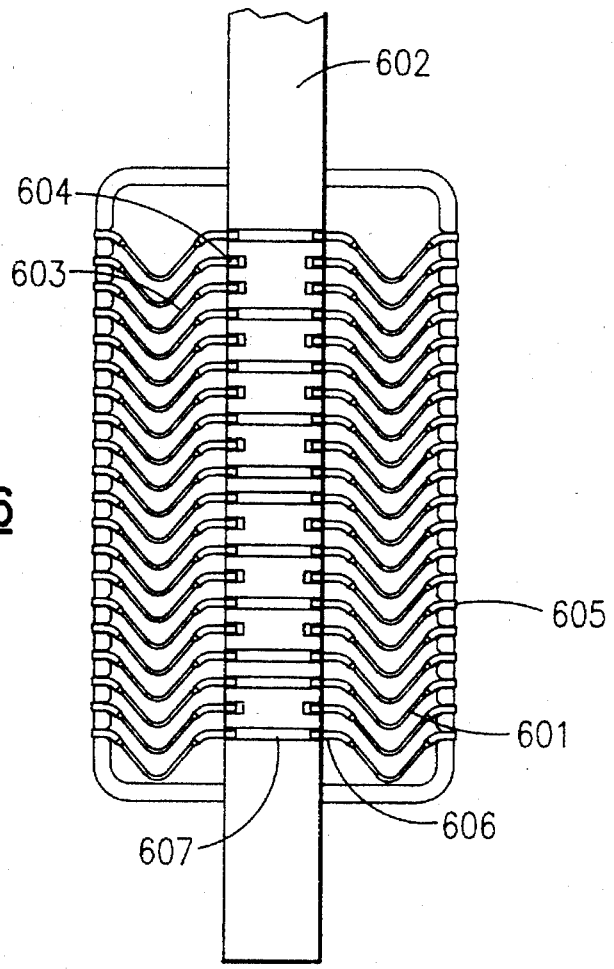
FIG. 6 shows an enhancement to the embodiment described in FIG. 4 with the connector assembly attached to both sides of the printed circuit board.

For even denser packaging of the electronic components, printed circuit boards can connect active components located on each side of the board. FIG. 6 illustrates an embodiment in which connectors with SCEs are applied to this application. A printed circuit board 602 has and array of SCEs 601 soldered at 606 on one surface and an array of SCEs 603 soldered to the other surface at 604. For power, ground, and matched front-to-back module signal wiring, the SCEs 601 and 603 may share the same plated-through-holes 607 located in the board. For non-common connection between the front and back side components, the SCEs are soldered at blind via 608 locations or on surface lands (not shown) similar to 404 of FIG. 4. This embodiment reduces the interconnect wire lengths between high performance integrated chips and also reduces the printed circuit board 602 size.

Each of the previously described embodiments has its own set of flatness, thermal mismatch, and x-y-z tolerance parameters which must be accounted by the SCE design. A finite element model (FEM) was constructed to analyze the force deflection characteristics of the variable cross-section SCE. FEM linear beam elements were used with each element indexed to its appropriate cross-sectional area property table. The node of the SCE coincident with the board was held fixed in both displacement and rotation. The node representing the SCE contact was displaced by variable amounts and its rotation was kept free. The curvature of the SCE was modeled by using many linear beam elements in a faceted manner. The pertinent material properties for the BeCu bulk material include Young's modulus and Poisson's ratio. Typically, these variables are approximately 127.5 GPa and 0.29 respectively. A minimum contact load for a reliable and repeatable contact is 30 grams for this area. An example of results from the FEM analysis for a 90 degree included angle, 0.25 nun diameter wire, and a 60 percent stamping compression for the center portion of the SCE reveals 0.1 mm as the minimum deflection to achieve the minimum loading. The maximum deflection is dependent on a tolerance analysis of the appropriate mounting hardware (i.e., board flatness, stiffener, substrate flatness, baseplate, etc.) and is system dependent. For illustrative purposes only, a maximum deflection of 0.3 mm is applied here.

Figure 7:
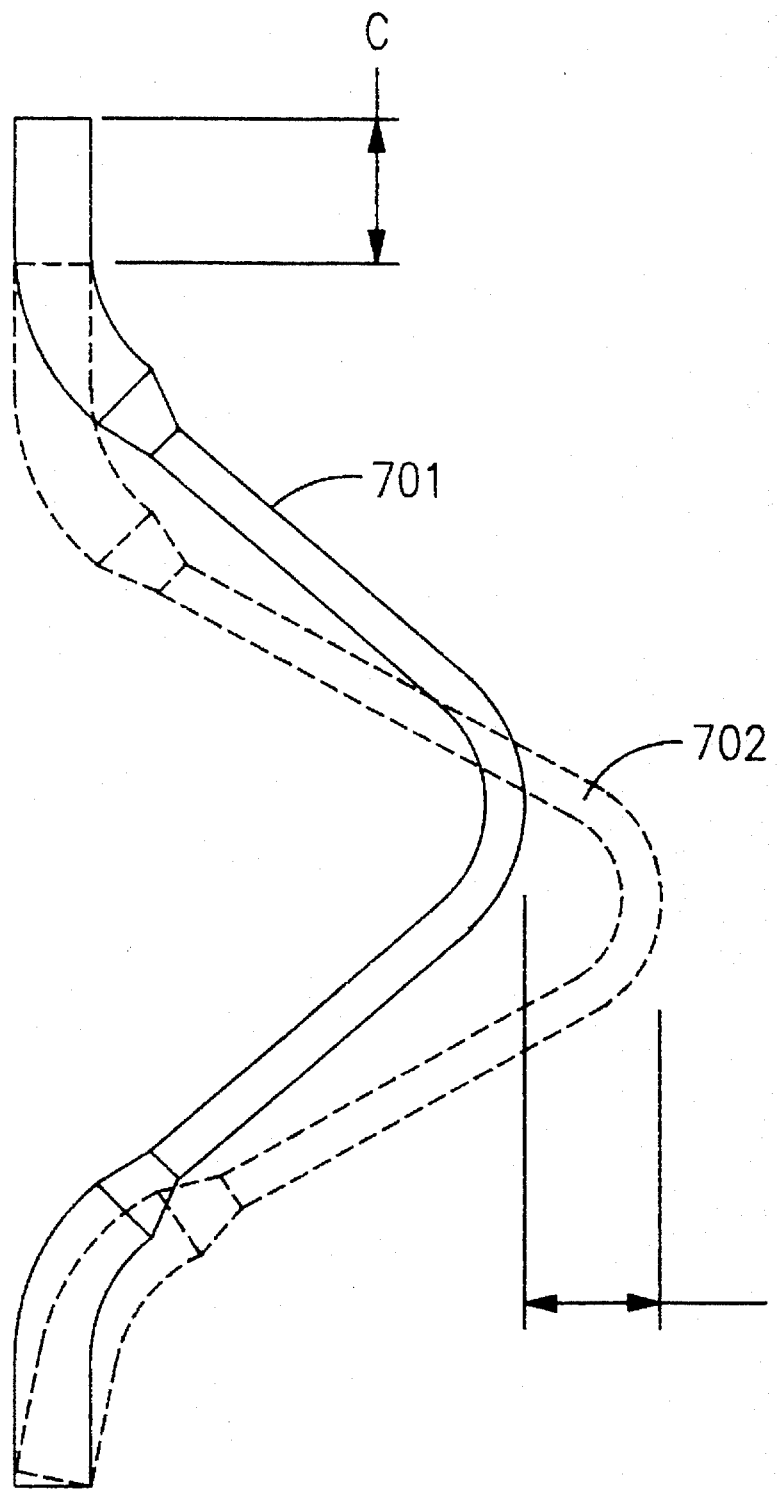
FIG. 7 describes the shape of the SCE when compressed.

At this deflection, the maximum contact loading is 70 grams which is consistent with today's state-of-the-art area array connectors. FIG. 7 shows typical FEM output of the deformed geometry with an exaggerated scale so that the deflection can be discerned. The SCE is compressed by a displacement, C, which results in an lateral movement of distance D (approx 0.25 mm). For a 60 degree included angle, the maximum loading is reduced to about 60 grams. Another geometry examined is one which the cross-sectional area is increased for reduced DC resistance. For this case, a 0.38 mm diameter wire is formed to a 0.15×0.74 mm rectangular cross-section. The flattening of the wire is a means to lower the spring rate of the larger diameter SCE to acceptable levels.

The spring rate of the SCE can be controlled by simple changes to its geometry. As a consequence, a customized SCE connector can consist of variable spring rate SCEs— i.e., the center and perimeter of the area array can have different spring rates to minimize substrate deflections while maintaining sufficient contact loads.

Figure 8:
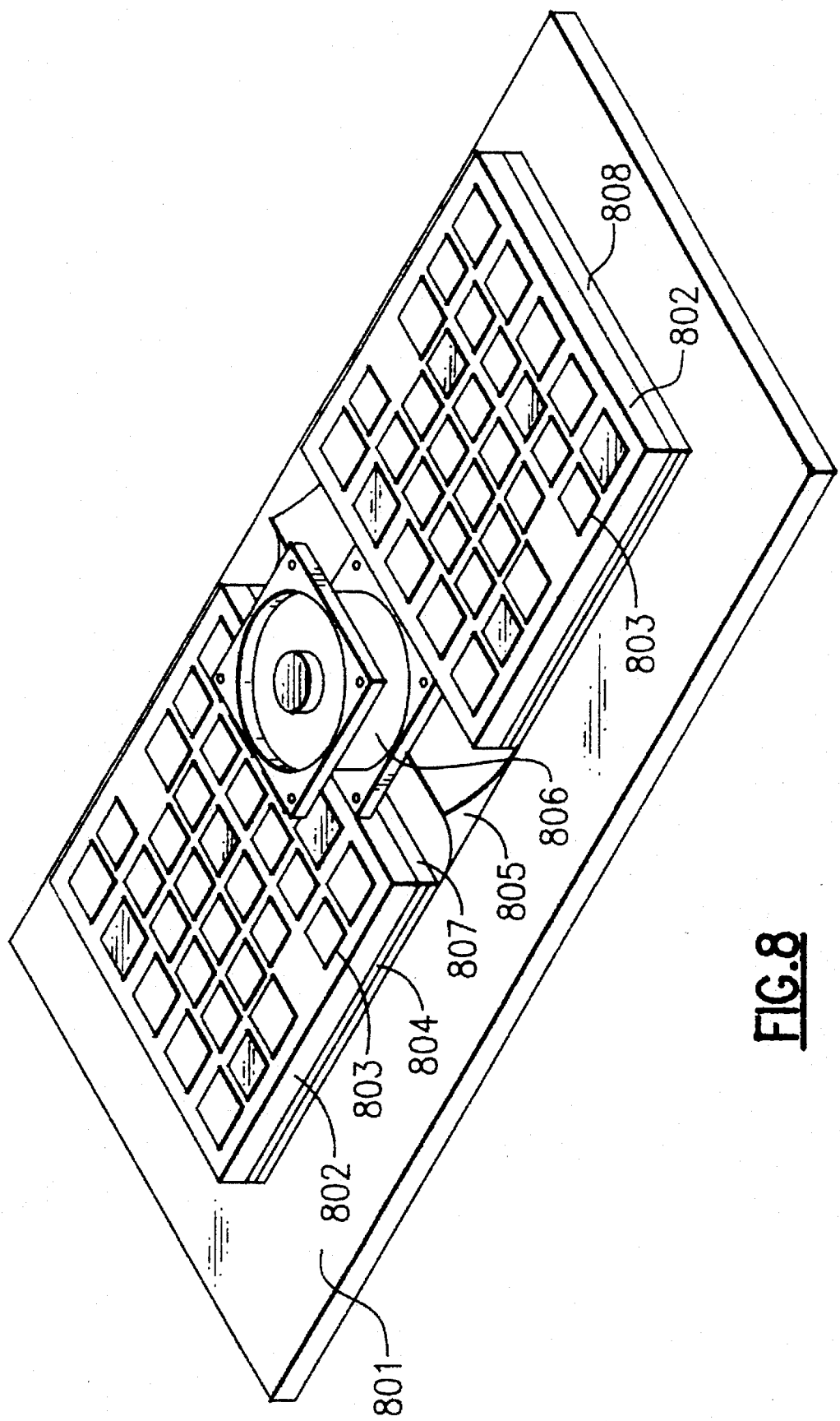
FIG. 8 shows a method of cooling the SCE by blowing air through the assembly.

The DC resistance for the rectangular SCE stated above (0.15×0.74 mm) comprises of a bulk value of 6.5 milliohms and a contact resistance value between 2 milliohms ("Clean") and 4.1 milliohms ("Dust"). Thus, the total connector resistance range for contact loading between 30 and 70 grams is 8.5 to 10.6 milliohms for this example. A worst case heat generation rate will be 0.011 Watts per 1 amp power contact. For a 70 mm by 70 mm connector with S=1.2 mm, approximately 16.5 Watts of power is dissipated in SCEs if 50% of the SCE carry power at the aforementioned rate. Referring to FIG. 3A, cooling of the connector is achieved by pumping a coolant in at 316, through the SCE array serially, and exhausting at the other end 317. The copper SCEs behave as pin fins with a uniform heat generation rate. Referring to FIG. 8 shows how an air deflector 805 with impinged air can be used to direct the air flow into the connector assembly 804. The air deflector 805 is secured to the printed circuit board 801 with an adhesive. Air is directed from a fan 806 or by some other means on to the deflector 805 and then into the connector assembly 804 through the opening at 807. Air exits at the other side of the assembly 808. The chips 803 and the ceramic component 802 are cooled by their own heat sinks in a dedicated air stream for that purpose. The deflector 805 would also be used as a board stiffener when mounting heavy ceramic components 802.

Figure 9:
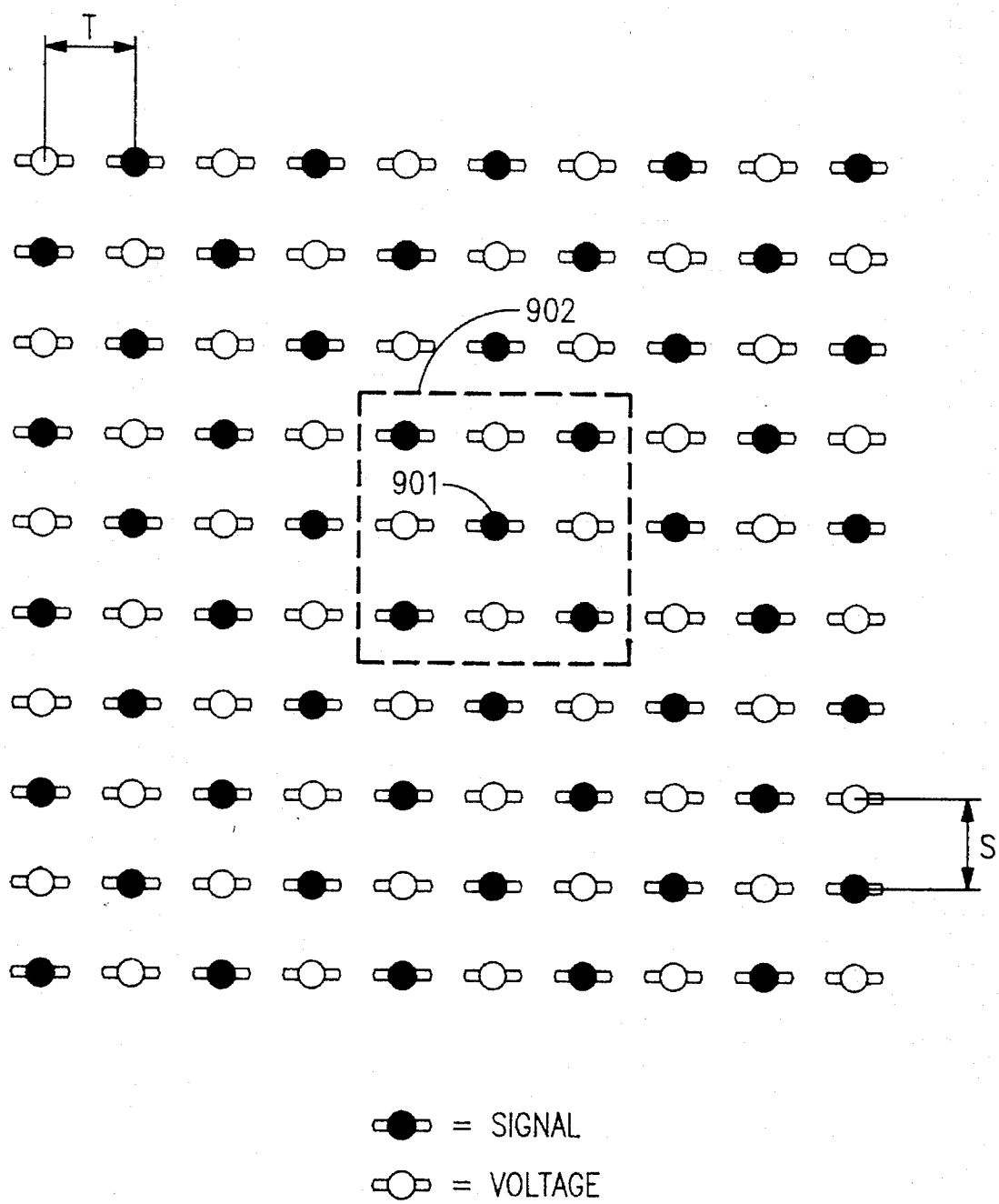
FIG. 9 shows the electrical grid used to evaluate the electrical performance of the connector.

The electrical performance of this connector design was determined using multiple electrical analysis finite difference tools. A 3×3 array of SCEs with the center and corner locations as the signal lines 901 was used as the calculation domain as shown in FIG. 9 by the dashed box 902. The dimensions S and T were 1.2 mm for the comparison to a tuning fork type connector presently used extensively for a high performance mainframe application. One 3-dimensional code was used to estimate the self and mutual inductances of each segment of the SCEs. Another code was used to reduce the hundreds of inductances to a matrix of 9×9 inductances accounting for di/dt direction through the conductors (i.e., signals v reference). As stated previously, the usage of the SCEs in a horizontally and vertically alternating signal/reference pattern forms the grid. This pattern aids shielding of the signals from one another. Additional shielding occurs in the connector because the shape of the SCE coupled with a tight spacing causes some overlapping of segments of the wire. These overlapping segments also alternate signal and reference usage but because of the included angle, their relative spacing is less than that at the SCE ends. Hence, the combination of overlapping SCEs and the SCE shape reduces the self inductance and further shields the signal lines.

The results indicated a coupled noise of ⅓ that of the tuning fork type of connector and a typical delay across the connector of 60% of the tuning fork delay.

It should be understood that the above-described embodiments of this application are presented as examples and not as limitations. Modification may occur to those skilled in the art. Accordingly, the invention is not to be regarded as being limited by the embodiments disclosed herein, but as defined by the appended claims.

Having thus described our invention, what we claim as new and desire to secure by Letters Patent is:

1. A connector assembly for interconnecting two electrical circuit components, arranged opposite each other, said assembly comprising:

a retainer having two open ends and holes formed through opposite surfaces;

a multiplicity of spring contact elements having opposite ends positioned in said opposite holes in said retainer extending beyond said retainer with sufficient length to engage said electrical circuit components, each of said spring contact elements being a single unit of spring metal having electrical conductivity;

an independent row separator supported in said retainer between adjacent rows of said spring contact elements, the row separator physically unconnected to any spring contact element, the row separator enabling unrestrained movement of contacts located at opposite ends of any spring contact element, and the row separator being made of electrically insulating material having low noise generation when contacted by any spring contact element.

2. The connector assembly in accordance with claim 1 wherein said spring contact element being beryllium copper.

3. The connector assembly in accordance with claim 1, said spring contact element further comprising a single unit of spring metal having opposite contact ends, a curved portion, a flat portion with a bend to form an included angle located between the contact ends, said opposite contact ends being aligned with an axis generally perpendicular to planes formed by said electrical circuit components.

4. The connector assembly in accordance with claim 3 wherein said opposite ends of said spring control element are circular in shape.

5. The connector assembly in accordance with claim 3 wherein said curved portion of said spring contact element being restrained in circular movement around the axis by the row separator.

6. The connector assembly in accordance with claim 3 wherein said flat portion with a bend of said spring contact element having a large surface and a thin edge.

7. The connector assembly in accordance with claim 1 wherein the said spring contact element ends are gold plated.

8. The connector assembly in accordance with claim 3, wherein at least one of said spring contact element is different in diameter, stamped shape, and included angle from other spring contact elements within the retainer.

9. The connector assembly in accordance with claim 3, wherein said holes to retain said spring contact elements are non-uniformly spaced in x or y direction.

10. The connector assembly in accordance with claim 3, wherein said holes to retain said spring contact elements are contoured at the interior surface for clearance of said spring contact elements when compressed.

11. The connector assembly in accordance with claim 1 wherein impedances of the said spring contact elements are matched to an application having multiple requirements by said locations of holes grouped in sets, each set having its own x and y spacing between said holes.

12. The connector assembly in accordance with claim 1, wherein said retainer having two opposite ends permanently open.

13. A connector assembly for interconnecting two electrical circuit components, arranged opposite each other, said assembly comprising:

a retainer having two open ends and holes formed through opposite surfaces, an upper half, a lower half and two opposite ends permanently open;

a multiplicity of spring contact elements having opposite ends positioned in said opposite holes in said retainer extending beyond said retainer with sufficient length to engage said electrical circuit components, each of said spring contact elements being a single unit of spring metal;

an independent separator supported in said retainer between adjacent rows of said spring contact elements to insulate and provide lateral support to obtain minimal electrical noise coupling among said spring contact elements; and coolant flowing among spring contact elements in said retainer.

14. The connector assembly in accordance with claim 13, said coolant flow being in one or more directions through said open ends.

15. The connector assembly in accordance with claim 3, a plurality of row separators are respectively located between a plurality of rows of spring contact elements within the retainer.

16. The connector assembly in accordance with claim 15, said separator having less than half of the height of the connector assembly.

17. A connector assembly for interconnecting two electrical circuit components, arranged opposite each other, said assembly comprising:

a retainer having two open ends and holes formed through opposite surfaces;

a multiplicity of spring contact elements having opposite ends positioned in said opposite holes in said retainer extending beyond said retainer with sufficient length to engage said electrical circuit components, each of said spring contact elements being a single unit of spring metal;

each said spring contact element being a single unit of spring metal having opposite contact ends, a curved portion, a flat portion with a bend to form an included angle, said opposite contact ends lying on same axis perpendicular to planes formed by said electrical circuit components;

an independent separator supported in said retainer between adjacent rows of said spring contact elements to insulate and provide lateral support to obtain minimal electrical noise coupling among said spring contact elements; and the separator being between each column of spring contact elements for containing and aligning said spring contact elements.

18. The connector assembly in accordance with claim 3, in which said flat portion of said spring contact element is aligned in a direction such that a bending portion is spaced near and adjacent said rectangular portion of said spring contact element by an amount which causes overlapping segments, having each adjacent said spring contact element being ground, overlapping said flat portions of said spring contact elements further shields the signal lines from one another.

19. The connector assembly in accordance with claim 1, further comprising said spring contact elements having opposing contacts in pressured engagement with pads of opposite electrical circuit components.

20. The connector assembly in accordance with claim 1, further comprising contacts on one side of said spring contact elements being bonded to pads of one of said electrical circuit components and contacts on the other side being pressure engaged with pads of the other of said electrical circuit components.

* * * * *